(12) United States Patent
Forbes et al.

(10) Patent No.: US 8,294,196 B2
(45) Date of Patent: *Oct. 23, 2012

(54) ERASABLE NON-VOLATILE MEMORY DEVICE USING HOLE TRAPPING IN HIGH-K DIELECTRICS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/577,567

(22) Filed: Oct. 12, 2009

(65) Prior Publication Data

US 2010/0027345 A1    Feb. 4, 2010

Related U.S. Application Data

(62) Division of application No. 11/153,963, filed on Jun. 16, 2005, now Pat. No. 7,602,009.

(51) Int. Cl.
  *H01L 29/788* (2006.01)
(52) U.S. Cl. ........ 257/318; 257/310; 257/311; 257/324; 257/E29.069; 257/E29.17
(58) Field of Classification Search .................. 257/288, 257/314, 315, 316, 318, 319, 320, 324, E27.067, 257/E27.085, 310, 311, E29.042, E29.069, 257/E29.179, E29.17
See application file for complete search history.

(56) References Cited

U.S. PATENT DOCUMENTS

| | | | |
|---|---|---|---|
| 4,313,178 A | 1/1982 | Stern et al. | |
| 6,451,641 B1 | 9/2002 | Halliyal et al. | |
| 6,674,120 B2 | 1/2004 | Fujiwara | |
| 6,674,138 B1 | 1/2004 | Halliyal et al. | |
| 6,674,667 B2 | 1/2004 | Forbes | |
| 6,683,811 B2* | 1/2004 | Ishii et al. | 365/185.24 |
| 6,721,204 B1* | 4/2004 | Yeh et al. | 365/185.24 |
| 6,740,605 B1 | 5/2004 | Shiraiwa et al. | |
| 6,791,883 B2* | 9/2004 | Swift et al. | 365/185.29 |
| 6,870,765 B2 | 3/2005 | Fujiwara | |
| 6,887,758 B2 | 5/2005 | Chindalore et al. | |
| 6,934,190 B1 | 8/2005 | Liu et al. | |
| 6,949,433 B1* | 9/2005 | Hidehiko et al. | 438/261 |
| 7,053,448 B2 | 5/2006 | Jeon et al. | |
| 7,315,060 B2 | 1/2008 | Iwata et al. | |
| 7,544,988 B2* | 6/2009 | Shukuri | 257/311 |

(Continued)

FOREIGN PATENT DOCUMENTS

EP    1487013 A2    12/2004

(Continued)

OTHER PUBLICATIONS

Eitan, Boaz, et al., "NROM: A Novel Localized Trapping, 2-Bit Nonvolatile Memory Cell", *IEEE Electron Device Letters*, 21(11), (Nov. 2000), 543-545.

(Continued)

*Primary Examiner* — Eduardo A Rodela
(74) *Attorney, Agent, or Firm* — Schwegman, Lundberg & Woessner, P.A.

(57) ABSTRACT

A non-volatile memory is described having memory cells with a gate dielectric. The gate dielectric is a multilayer charge trapping dielectric between a control gate and a channel region of a transistor to trap positively charged holes. The multilayer charge trapping dielectric comprises at least one layer of high-K.

36 Claims, 2 Drawing Sheets

U.S. PATENT DOCUMENTS

| | | | |
|---|---|---|---|
| 7,602,009 B2* | 10/2009 | Forbes et al. | 257/324 |
| 2003/0042534 A1* | 3/2003 | Bhattacharyya | 257/317 |
| 2004/0094794 A1* | 5/2004 | Wu | 257/316 |
| 2004/0145950 A1 | 7/2004 | Yeh et al. | |
| 2004/0251489 A1 | 12/2004 | Jeon et al. | |
| 2004/0251490 A1 | 12/2004 | Chae et al. | |
| 2004/0264236 A1 | 12/2004 | Chae et al. | |
| 2005/0093054 A1 | 5/2005 | Jung et al. | |
| 2005/0104117 A1 | 5/2005 | Mikolajick et al. | |
| 2005/0173766 A1 | 8/2005 | Chae et al. | |
| 2005/0189597 A1 | 9/2005 | Masuoka et al. | |
| 2005/0230766 A1* | 10/2005 | Nomoto et al. | 257/411 |
| 2005/0275012 A1 | 12/2005 | Nara et al. | |
| 2006/0017121 A1 | 1/2006 | Arai et al. | |
| 2006/0091448 A1 | 5/2006 | Mikolajick et al. | |
| 2007/0082507 A1* | 4/2007 | Iyer et al. | 438/795 |

FOREIGN PATENT DOCUMENTS

| | | | |
|---|---|---|---|
| WO | WO-2006138370 | A2 | 12/2006 |
| WO | WO-2006138370 | A3 | 12/2006 |

OTHER PUBLICATIONS

Fischetti, M. V., et al., "The effect of gate metal and SiO2 thickness of the generation of donor states at the Si—SiO2 interface", *Journal of Applied Physics*, 57(2), (Jan. 1985), 418-424.

Han, K. Michael, et al., "Sequential substrate and channel hot electron injection to separate oxide and interface traps in n-MOSTs", *Solid-State Electronics*, vol. 38, No. 1, (1995), 105-113.

Liu, C. T., et al., "A New Mode of Hot Carrier Degradation in 0.18um CMOS Technologies", *1998 Symposium on VLSI Technology Digest of Technical Papers*, (1998), 176-177.

Lusky, Eli, et al., "Characterization of channel hot electron injection by the subthreshold slope of NROM/sup TM/ device", *IEEE Electron Device Letters*, 22(11), (Nov. 2001), 556-558.

Maayan, Eduardo, et al., "A 512Mb NROM Flash Data Storage Memory with 8MB/s Data Rate", *Solid-State Circuits Conference, 2002. Digest of Technical Papers. ISSCC*, (2002), 4 pgs.

Neugroschel, Arnost, et al., "Direct-Current Measurements of Oxide and Interface Traps on Oxidized Silicon", *IEEE Transactions on Electron Devices*, vol. 42, No. 9, (1995), 1657-1662.

Ning, T. H., "Capture cross section and trap concentration of holes in silicon dioxide", *Journal of Applied Physics*, 47(3), (Mar. 1976), 1079-1081.

Ning, T. H., et al., "Completely electrically reprogrammable nonvolatile memory device using conventional p-channel MOSFET", *IBM Technical Disclosure Bulletin*, vol. 20, No. 5, (Oct. 1977), 2016.

Ning, T. H., et al., "Erasable nonvolatile memory device using hole trapping in SiO2", *IBM Technical Disclosure Bulletin*, vol. 18, No. 8, (Jan. 1976), 2740-2742.

Nishida, Toshikazu, "BiMOS and SMOSC structures for MOS parameter measurement", *Solid-State Electronics*, vol. 35, No. 3, (Mar. 1992), 357-369.

Robertson, J., "High dielectric constant oxides", *Eur. Phys. J. Appl. Phys.*, vol. 28, (2004), 265-291.

Samanta, Piyas, et al., "Coupled charge trapping dynamics in thin SiO2 gate oxide under Fowler-Nordheim stress at low electron fluence", *Journal of Applied Physics*, 83(5), (Mar. 1998), 2662-2669.

US 6,859,396, 02/2005, Forbes (withdrawn)

* cited by examiner

ERASABLE NON-VOLATILE MEMORY DEVICE USING HOLE TRAPPING IN HIGH-K DIELECTRICS

RELATED APPLICATION

This application is a Divisional of U.S. application Ser. No. 11/153,963, filed Jun. 16, 2005, now U.S. Pat. No. 7,602,009, which is incorporated herein by reference in its entirety.

FIELD OF THE INVENTION

The present invention relates to non-volatile memory devices, and more particularly to hole trapping memory devices.

BACKGROUND

Flash memory is non-volatile, which means that it stores information on a semiconductor in a way that does not need power to maintain the information in the chip. Flash memory is based on the Floating-Gate Avalanche-Injection Metal Oxide Semiconductor (FAMOS transistor), which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array. Further, flash memory stores information in an array of transistors, called "cells," each of which traditionally stores one or more bits of information.

A flash cell is similar to a standard Metal Oxide Semiconductor Field Effect Transistor (MOSFET) transistor, except that it has two gates instead of just one. One gate is the control gate (CG) like in other MOS transistors, but the second is a floating gate (FG) that is insulated all around by an oxide layer. The FG is between the CG and the substrate. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the CG, electrical current will either flow or not flow between the cell's source and drain connections, depending on the Vt of the cell. This presence or absence of current is sensed and translated into 1's and 0's, reproducing the stored data.

A different non-volatile memory, Nitrided Read Only Memory (NROM), utilizes inherent physical features of an oxide-nitride-oxide (ONO) gate dielectric and known mechanisms of program and erase operations to create two separate physical bits per cell. The NROM cell is based on localized negative charge trapping. The cell is an n-channel MOSFET device where the gate dielectric is replaced by an ONO stack. Two spatially separated narrow charge distributions are stored in the nitride layer above junction edges. The NROM cell is programmed by channel hot electron injection.

The NROM memory devices have attracted much attention due to their advantages over the traditional floating-gate flash device, including lower programming voltage, better scalability, and improved cycling endurance. An advantage of the NROM cell is the negligible vertical retention loss due to inhibition of direct tunneling. Further, in floating gate technology the electron charge is stored in a conductive layer, and any minor oxide defect or oxide trapped charge under the gate might cause leakage and loss of all the stored charge. NROM technology, however, uses a nitride insulator as a retaining material, hence only a large defect in the oxide (comparable to the cell size) could degrade retention.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface onto which a layer is deposited according to the present invention, for example to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures. The term conductor is understood to include semiconductors, and the term insulator is defined to include any material that is less electrically conductive than the materials referred to as conductors.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dice as is well known in the art.

Relative terms such as above, below, lateral and adjacent are not limited to a specific coordinate system. These terms are used to describe relative positions between components and are not intended to be limitations. As such, additional components can be positioned between components that are above, below, lateral and adjacent to each other. Further, the figures are provided to help facilitate an understanding of the detailed description, are not intended to be accurate in scale, and have been simplified.

The following detailed description is, therefore, not to be taken in a limiting sense, and the scope of the present invention is defined only by the appended claims, along with the full scope of equivalents to which such claims are entitled.

Figure 1:
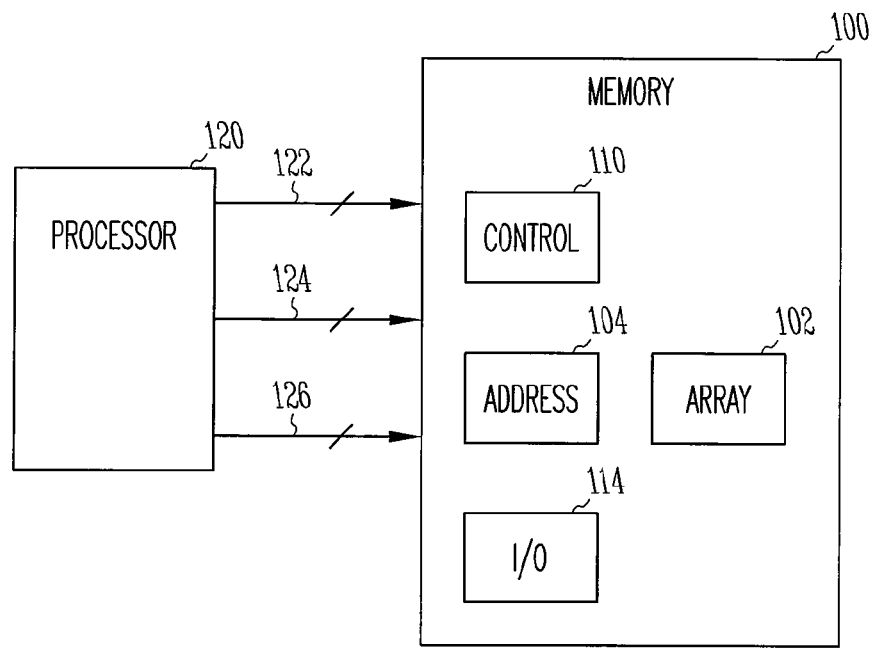
FIG. 1 is a block diagram of a memory according to one embodiment of the invention.

FIG. 1 is a simplified block diagram of an integrated circuit memory device 100 in accordance with an embodiment of the invention. The memory device 100 includes an array of non-volatile memory cells 102, address circuitry 104, control circuitry 110, and Input/Output (I/O) circuitry 114.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, digital cameras, personal digital assistants (PDA's) and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data is written to or read from the memory cells across data, DQ, lines 126.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

In embodiments of the invention, a p-channel MOSFET with a high dielectric constant, high-K, gate insulator with hole trapping in the gate insulator is provided as a memory device. Programming can be achieved by hot hole injection from a transistor channel, light generated holes accelerated in an electric field, holes injected into the device by a buried p-n junction, or holes generated at the gate insulator-substrate interface by highly energetic electrons tunneling off of the gate. Data can be read by operating the transistor in the forward direction, or if holes are injected only near the drain by operating the transistor in the reverse direction.

Different methods of programming holes in the high-K dielectric can be employed in the present invention. Many of the available programming techniques are well known in the art and briefly explained below. For purposes of simplicity, control circuitry 110 is referred to herein as encompassing program circuitry to program a multilayer charge trapping dielectric by injecting holes onto the at least one layer of high-K dielectric.

Flash memories based on p-channel MOSFETs using hole trapping in gate oxides as a memory technique and hot hole injection are known. Further, hole trapping has been described for use in fuses and anti-fuse devices. In such memories and structures, holes from a silicon substrate are generated by large negative gate voltages, hot hole injection from the channel, or by light.

Figure 2:
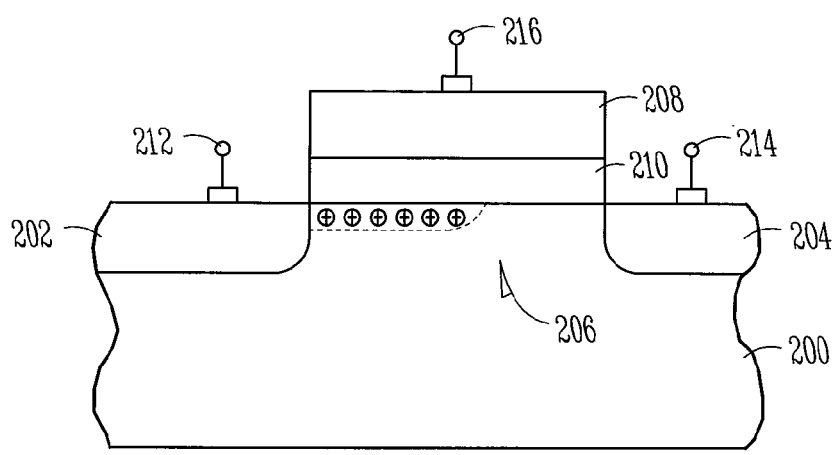
FIG. 2 is a cross-section of a prior art transistor.

FIG. 2 depicts a simplified cross-section of a prior art metal oxide semiconductor field effect transistor (MOSFET) in a substrate 200. The MOSFET includes a source region 202, a drain region 204, and a channel region 206 in the substrate 200 between the source region 202 and the drain region 204. A gate 208 is separated from the channel region 206 by a gate oxide 210. A source line 212 is coupled to the source region 202.

In a memory device, a bitline conductor 214 is coupled to the drain region 204. A wordline conductor 216 is coupled to the gate 208. In conventional operation, a drain to source voltage potential (Vds) is set up between the drain region 204 and the source region 202. A negative voltage potential is then applied to the gate 208 via the wordline 216. Once the negative voltage potential applied to the gate exceeds the characteristic voltage threshold (Vt) of the MOSFET, the channel 206 forms in the substrate 200 between the drain region 204 and the source region 202. Formation of the channel 206 permits conduction between the drain region 204 and the source region 202, and a current (Ids) can be detected at the drain region 204.

During operation of the conventional MOSFET of FIG. 2, some change in the device drain current can be programmed for MOSFETs operated in the forward direction due to holes being trapped in the gate oxide 210 near the drain region 204. This can be accomplished by hot hole injection when the transistor is operated with a drain voltage, Vds, near the gate voltage, Vgs.

Since in this case the holes are trapped near the drain region 204, however, they are not very effective in changing the characteristics of the MOSFET. They are only effective if the transistor is operated in the reverse direction during the read cycle as in reading an NROM device. As such, hot hole injection of the prior art can be used with embodiments of the present invention.

Alternatively, a sufficiently large negative gate bias voltage can be applied to cause tunnel electrons from the gate to gain enough energy to exceed the band gap energy of the gate insulator. As a result, energetic hole-electron pairs are generated in the silicon substrate and the holes have enough energy to overcome the barrier at the insulator and substrate interface.

The holes are then injected from the substrate into the gate dielectric, where they remain trapped. A large shift in the threshold voltage of the p-channel MOSFET results. The device can subsequently be reset by applying a positive gate bias voltage. It is known in the art that the positive charge generated in gate oxides by hot hole injection can be erased by avalanche electron injection.

Another prior art method to inject holes is to generate electron hole pairs by providing incident light. The holes are accelerated towards the gate insulator or oxide and trapped in the gate insulator. Trapped positive charge results in a change in the device drain current and can be used as a memory effect or memory device. This is accomplished by hot hole injection when the transistor is operated with a drain voltage near Vgs. Erasure is achieved by hot electron injection by operation with a drain voltage, Vds, much larger than the gate voltage, Vgs.

Figure 3:
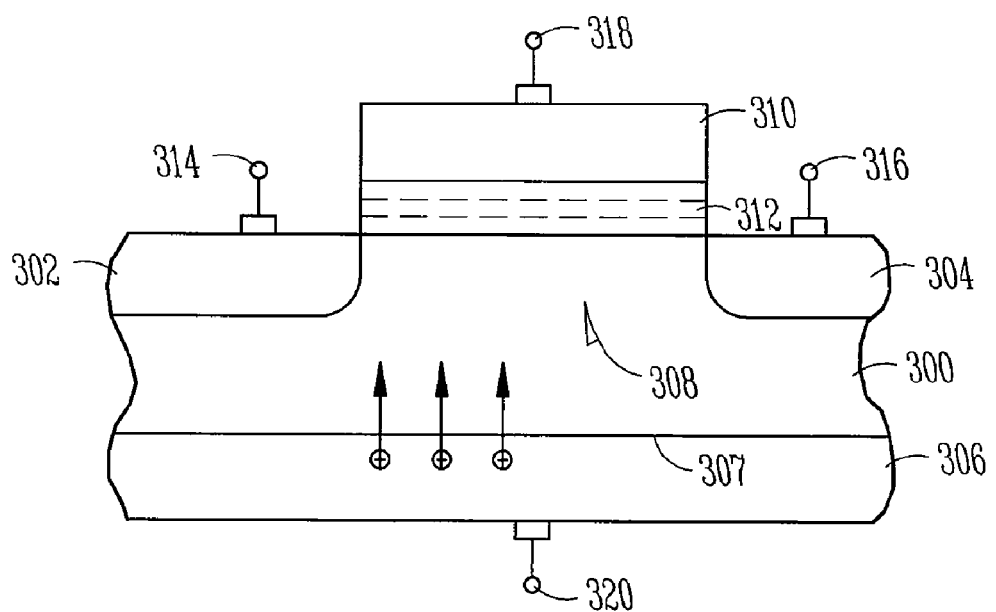
FIG. 3 is a cross-section of a transistor of one embodiment with a buried P-N junction.

FIG. 3 depicts a semiconductor device having a bipolar (pnp) transistor-like structure, according to one embodiment of the invention, which allows uniform injection of holes. The device includes a source region 302, a drain region 304, a back gate region 306, and a channel region 308 in the substrate 300 between the source region 302 and the drain region 304. A gate 310 is separated from the channel region 308 by a multi layer gate dielectric 312. The gate dielectric contains at least one layer of a high-K dielectric, as explained below. A source line 314 is coupled to the source region 302. A bitline conductor 316 is coupled to the drain region 304. A wordline conductor 318 is coupled to the gate 310. A terminal 320 is coupled to the back gate region 306. The back gate 306 forms a p-n junction 307 with substrate 300.

When a positive voltage Veb is applied to the back gate region 306 via the terminal 320 and a negative voltage is applied to the gate 310 via the wordline 318, holes are injected from the p-n junction in the back gate region into the gate insulator 312. This effect is depicted in FIG. 3 and results in a change in the device threshold voltage.

Regardless of the programming method employed, embodiments of the present invention use a high-K (high dielectric constant) dielectric in the gate dielectric to trap positive charged holes. For the present embodiments, high-K dielectrics are defined as those with a dielectric constant greater than that of silicon nitride (i.e., >k=7).

Figure 4:
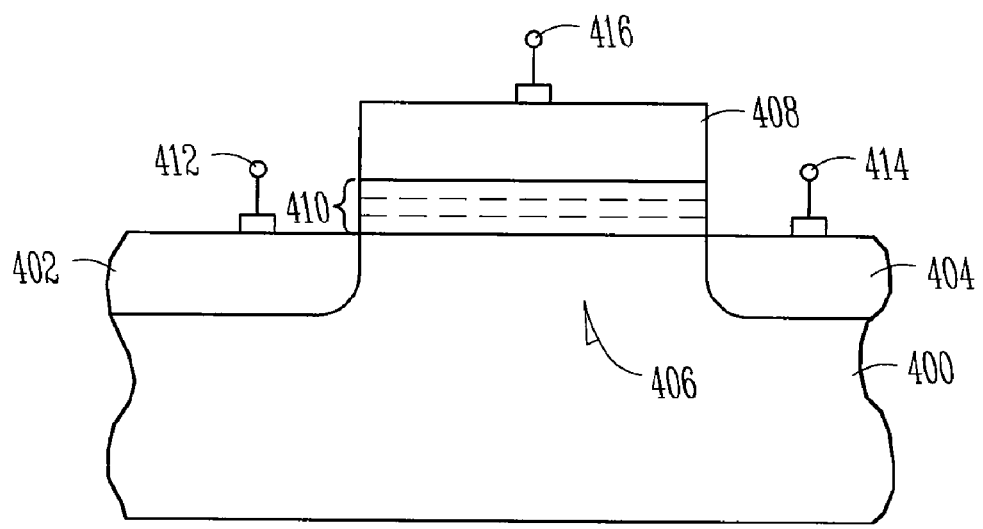
FIG. 4 is a cross-section of a transistor of one embodiment with a multi-layered dielectric.

FIG. 4 depicts a simplified cross-section of a metal oxide semiconductor field effect transistor (MOSFET) memory cell of the present invention. The memory cell is formed in a substrate 400. The cell includes a source region 402, a drain region 404, and a channel region 406 in the substrate 400 between the source region 402 and the drain region 404. A gate 408 is separated from the channel region 406 by a multi layer gate dielectric 410. The dielectric layers include one or more layers of high-K dielectric material.

A source line 412 is coupled to the source region 402. In a memory device, a bitline conductor 414 is coupled to the drain region 404. A wordline conductor 416 is coupled to the gate 408.

High-K dielectrics have smaller bandgap energies, and less voltage is required to inject holes into the gate insulator 410. These high-K dielectrics can be composite layers, or nanolaminates, formed by oxidation, chemical vapor deposition (CVD), evaporation, or atomic layer deposition (ALD), depending on the material used. The band gap energy of high-K dielectrics becomes smaller as the dielectric constant increases.

Example high-K dielectrics of the present invention gate dielectric include a high-K dielectric between two layers of an oxide. The high-K dielectric layer in the composite gate insulator can be selected from Table 1 and the associated fabrication techniques:

TABLE 1

| Dielectric | ALD | CVD | Evaporation |
|---|---|---|---|
| $HfO_2$ | X | X | X |
| $ZrO_2$ | X | X | |
| ZrSnTiO | X | | |
| ZrON | X | | X |
| ZrAlO | X | | |
| $ZrTiO_4$ | X | | |
| $Al_2O_3$ | X | | |
| $La_2O_3$ | X | | |
| $LaAlO_3$ | X | | X |
| $HfAlO_3$ | X | | |
| HfSiON | X | | |
| $Y_2O_3$ | | | X |
| $Gd_2O_3$ | | | X |
| $Ta_2O_5$ | X | | |
| $TiO_2$ | X | | X |
| $Pr_2O_3$ | X | | X |
| $CrTiO_3$ | | | X |
| YSiO | | | X |

Further examples of the present invention gate dielectric include an oxide-nitride—high-K dielectric composite layered gate insulator. The high-K dielectric layer in the composite gate insulator can be selected from ALD formed $Al_2O_3$, $HfO_2$ or $ZrO_2$.

Further examples of the present invention gate dielectric include three stacked layers of high-K dielectrics. The high-K dielectric layers in the composite gate insulator can be selected from dielectrics of Table 2 formed by ALD.

TABLE 2

| First High-K | Second High-K | Third High-K |
|---|---|---|
| $HfO_2$ | $Ta_2O_5$ | $HfO_2$ |
| $La_2O_3$ | $HfO_2$ | $La_2O_3$ |
| $HfO_2$ | $ZrO_2$ | $HfO_2$ |
| Lanthanide (Pr, Ne, Sm, Gd and Dy) Oxide | $ZrO_2$ | Lanthanide (Pr, Ne, Sm, Gd and Dy) Oxide |
| Lanthanide (Pr, Ne, Sm, Gd and Dy) Oxide | $HfO_2$ | Lanthanide (Pr, Ne, Sm, Gd and Dy) Oxide |

A further example of the present invention gate dielectric includes a high-K-high-K-high-K dielectric composite layered gate insulator formed comprising evaporated $HfO_2$ between two layers of ALD formed Lanthanide (Pr, Ne, Sm, Gd and Dy) Oxide.

The invention claimed is:

1. A non-volatile memory comprising:
   source and drain regions located in a transistor body region, the source and drain regions are laterally spaced apart to form a channel region therebetween;
   a control gate isolated from and located vertically above the channel region;
   a multilayer charge trapping dielectric between the control gate and the channel region to trap positively charged holes, wherein the multilayer charge trapping dielectric comprises at least one layer of high-K dielectric having a dielectric constant (K) greater than dielectric constants of silicon nitride;
   a discrete bi-polar junction substantially underlying the channel region, the discrete bi-polar junction coupled to a terminal and configured to operatively inject holes across the discrete bi-polar junction such that hole injection occurs into the multilayer charge trapping dielectric; and
   program circuitry to program the multilayer charge trapping dielectric, the program circuitry arranged to provide a voltage difference across the discrete bi-polar junction to uniformly inject holes across the discrete bi-polar junction such that the hole injection occurs into the at least one layer of high-K dielectric by applying a positive voltage to the terminal and a negative voltage to the control gate.

2. The non-volatile memory of claim 1, wherein the multilayer charge trapping dielectric comprises a layer of high-K dielectric located between first and second layers of oxide.

3. The non-volatile memory of claim 2, wherein the layer of high-K dielectric is selected from the group $HfO_2$, $ZrO_2$, ZrSnTiO, ZrON, ZrAlO, $ZrTiO_4$, $Al_2O_3$, $La_2O_3$, $LaAlO_3$, $HfAlO_3$, HfSiON, $Y_2O_3$, $Gd_2O_3$, $Ta_2O_5$, $TiO_2$, $Pr_2O_3$, $CrTiO_3$, and YSiO.

4. The non-volatile memory of claim 1, wherein the multilayer charge trapping dielectric comprises an oxide layer, a nitride layer, and a layer of high-K dielectric.

5. The non-volatile memory of claim 4, wherein the layer of high-K dielectric is selected from $Al_2O_3$, $HfO_2$, or $ZrO_2$.

6. The non-volatile memory of claim 5, wherein the layer of high-K dielectric is formed using an atomic layer deposition process.

7. The non-volatile memory of claim 1, wherein the multilayer charge trapping dielectric comprises first, second, and third layers of high-K dielectric.

8. The non-volatile memory of claim 7, wherein the multilayer charge trapping dielectric comprises a layer of $Ta_2O_5$ located between first and second layers of $HfO_2$.

9. The non-volatile memory of claim 7, wherein the multilayer charge trapping dielectric comprises a layer of $HfO_2$ located between first and second layers of $La_2O_3$.

10. The non-volatile memory of claim 7, wherein the multilayer charge trapping dielectric comprises a layer of $ZrO_2$ located between first and second layers of $HfO_2$.

11. The non-volatile memory of claim 7, wherein the multilayer charge trapping dielectric comprises a layer of $ZrO_2$ located between first and second layers of Lanthanide Oxide.

12. The non-volatile memory of claim 7, wherein the multilayer charge trapping dielectric comprises a layer of $HfO_2$ located between first and second layers of Lanthanide Oxide.

13. A memory device comprising:
an array of positive charge hole trapping transistor memory cells, each memory cell including:
source and drain regions located in a transistor body region, the source and drain regions are laterally spaced apart to form a channel region therebetween,
a control gate isolated from and located vertically above the channel region,
a multilayer charge trapping dielectric between the control gate and the channel region to trap positively charged holes, wherein the multilayer charge trapping dielectric comprises at least one layer of high-K dielectric having a dielectric constant (K) greater than dielectric constants of silicon nitride; and
a discrete bi-polar junction substantially underlying the channel region, the discrete bi-polar junction coupled to a terminal and configured to uniformly inject holes across the discrete bi-polar junction such that hole injection occurs into the at least one layer of high-K dielectric; and
write circuitry to write data to the memory cells during a write operation, the write circuitry arranged to provide a voltage difference across the discrete bi-polar junction to uniformly inject holes across the discrete bi-polar junction such that the hole injection occurs into the at least one layer of high-K dielectric by applying a positive voltage to the terminal and a negative voltage to the control gate.

14. The memory device of claim 13, wherein the multilayer charge trapping dielectric comprises a layer of high-K dielectric located between first and second layers of oxide.

15. The memory device of claim 13, wherein the multilayer charge trapping dielectric comprises an oxide layer, a nitride layer, and a layer of high-K dielectric.

16. The memory device of claim 13, wherein the multilayer charge trapping dielectric comprises first, second, and third layers of high-K dielectric.

17. The memory device of claim 13, wherein the at least one layer of high-K dielectric comprises an oxide of one of Praseodymium (Pr), Neodymium (Nd), Samarium (Sm), Gadolinium (Gd), or Dysprosium (Dy).

18. A method of programming a non-volatile memory transistor comprising:
injecting positively charged holes into a multilayer dielectric located between a control gate and a channel region of the transistor, the multilayer dielectric comprising at least one layer of high-K dielectric having a dielectric constant (K) greater than seven and selected from the group: ZrSnTiO, ZrON, ZrAlO, ZrTiO$_4$, HfAlO$_3$, HfSiON, CrTiO$_3$, and YSiO; and
trapping the positively charged holes in the at least one layer of high-K dielectric, wherein the injecting positively charged holes comprises uniform hole injection across a p-n device in response to a voltage difference applied across the p-n device, the p-n device having an n-type region substantially underlying the channel region and having a p-type region substantially underlying the n-type region, the p-type region on and coupled to a terminal used in applying the voltage difference.

19. A non-volatile memory comprising:
a source and a laterally spaced-apart drain region positioned in a substrate to form a channel region therebetween;
a control gate isolated from the channel region and positioned on a first side of the channel region;
a multilayer charge trapping dielectric positioned between the control gate and the channel region to trap positively charged holes, wherein the multilayer charge trapping dielectric comprises at least one layer of high-K dielectric having a dielectric constant (K) greater than dielectric constants of silicon nitride; and
a back gate structure positioned on an opposing second side of the channel region from the multilayer charge trapping dielectric, the back gate structure including a semiconductor junction region having a semiconductor junction separating regions of different conductivity type, the semiconductor junction region operable to program the multilayer charge trapping dielectric by injecting holes from the semiconductor junction region into the at least one layer of high-K dielectric when a predetermined voltage is applied to the semiconductor junction region such that a voltage difference is applied across the semiconductor junction.

20. The non-volatile memory of claim 19, wherein the multilayer charge trapping dielectric includes composite layers of high-K dielectrics.

21. The non-volatile memory of claim 19, wherein the semiconductor junction region is configured to inject the holes into the at least one layer of the high-K dielectric when the semiconductor junction region and the control gate are suitably biased.

22. The non-volatile memory of claim 19, wherein the multilayer charge trapping dielectric comprises a layer of high-K dielectric located between first and second layers of oxide, wherein the layer of high-K dielectric includes one of HfO$_2$, ZrO$_2$, ZrSnTiO, ZrON, ZrAlO, ZrTiO$_4$, Al$_2$O$_3$, La$_2$O$_3$, LaAlO$_3$, HfAlO$_3$, HfSiON, Y$_2$O$_3$, Gd$_2$O$_3$, Ta$_2$O$_5$, TiO$_2$, Pr$_2$O$_3$, CrTiO$_3$, or YSiO.

23. The non-volatile memory of claim 19, wherein the multilayer charge trapping dielectric comprises an oxide layer, a nitride layer, and a layer of high-K dielectric, wherein the layer of high-K dielectric includes one of Al$_2$O$_3$, HfO$_2$, or ZrO$_2$.

24. The non-volatile memory of claim 23, wherein the layer of high-K dielectric is formed using an atomic layer deposition process.

25. The non-volatile memory of claim 19, wherein the multilayer charge trapping dielectric comprises first, second, and third layers of high-K dielectric.

26. The non-volatile memory of claim 25, wherein the multilayer charge trapping dielectric comprises a layer of Ta$_2$O$_5$ located between first and second layers of HfO$_2$.

27. The non-volatile memory of claim 25, wherein the multilayer charge trapping dielectric comprises a layer of HfO$_2$ located between first and second layers of La$_2$O$_3$.

28. The non-volatile memory of claim 25, wherein the multilayer charge trapping dielectric comprises a layer of ZrO$_2$ located between first and second layers of HfO$_2$.

29. The non-volatile memory of claim 25, wherein the multilayer charge trapping dielectric comprises a layer of ZrO$_2$ located between first and second layers of Lanthanide Oxide.

30. The non-volatile memory of claim 25, wherein the multilayer charge trapping dielectric comprises a layer of HfO$_2$ located between first and second layers of Lanthanide Oxide.

31. A memory device comprising:
an array of cells, each memory cell including:
a source and a laterally spaced-apart drain region positioned in a substrate to form a channel region therebetween;
a control gate isolated from the channel region and positioned on a first side of the channel region;

a multilayer charge trapping dielectric positioned between the control gate and the channel region to trap positively charged holes, wherein the multilayer charge trapping dielectric comprises at least one layer of high-K dielectric having a dielectric constant (K) greater than dielectric constants of silicon nitride; and a back gate structure positioned on an opposing second side of the channel region from the multilayer charge trapping dielectric, the back gate structure including a semiconductor junction region having a semiconductor junction separating regions of different conductivity type, the semiconductor junction region operable to program the multilayer charge trapping dielectric by injecting holes from the semiconductor junction region into the at least one layer of high-K dielectric when a predetermined voltage is applied to the semiconductor junction region such that a voltage difference is applied across the semiconductor junction.

32. The memory device of claim 31, wherein the multilayer charge trapping dielectric includes a nanolaminate of high-K dielectrics.

33. The memory device of claim 31, wherein the semiconductor junction region is configured to inject the holes into the at least one layer of the high-K dielectric when the semiconductor junction region and the control gate are suitably biased.

34. The memory device of claim 31, wherein the multilayer charge trapping dielectric comprises a layer of high-K dielectric located between first and second layers of oxide.

35. The memory device of claim 31, wherein the multilayer charge trapping dielectric comprises an oxide layer, a nitride layer, and a layer of high-K dielectric.

36. The memory device of claim 31, wherein the multilayer charge trapping dielectric comprises first, second, and third layers of high-K dielectric.

* * * * *